United States Patent
Takabayashi

(10) Patent No.: US 6,696,822 B2
(45) Date of Patent: Feb. 24, 2004

(54) VOLTAGE REGULATOR WITH A CONSTANT CURRENT CIRCUIT AND ADDITIONAL CURRENT SOURCING/ SINKING

(75) Inventor: Yasutaka Takabayashi, Yamanashi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/207,388

(22) Filed: Jul. 30, 2002

(65) Prior Publication Data

US 2003/0030417 A1 Feb. 13, 2003

(30) Foreign Application Priority Data

Jul. 30, 2001 (JP) ........................................ 2001-229374

(51) Int. Cl.$^7$ ................................................. G05F 3/16
(52) U.S. Cl. ...................... 323/224; 323/226; 323/270; 323/274
(58) Field of Search ................................. 323/223, 224, 323/226, 266, 270, 273, 274, 313

(56) References Cited

U.S. PATENT DOCUMENTS 6,333,623 B1 * 12/2001 Heisley et al. ............... 323/224
6,548,991 B1 * 4/2003 Maksimovic et al. ........ 323/224
6,597,156 B2 * 7/2003 Gogolla ....................... 323/224

* cited by examiner

*Primary Examiner*—Jeffrey Sterrett
(74) *Attorney, Agent, or Firm*—Rabin & Berdo, P.C.

(57) ABSTRACT

A voltage regulator includes a constant current circuit which is connected between an input node with which a power supply voltage is supplied and an output node to which a load is connected and which supplies constant current to the output node. The voltage regulator also includes a first transistor which is provided in parallel to the constant current circuit and which flows insufficient current to the output node when current flowing through the load is larger than the constant current and a second transistor which is provided between the output node and a common potential node and which flows surplus current to the common potential node when current flowing through the load is less than the constant current. The voltage regulator also includes a control circuit which controls a conductive state of the first and the second transistors so that an output voltage of the output node is maintained at constant voltage.

18 Claims, 5 Drawing Sheets

VOLTAGE REGULATOR WITH A CONSTANT CURRENT CIRCUIT AND ADDITIONAL CURRENT SOURCING/SINKING

BACKGROUND OF THE INVENTION

1. Field of the Invention

The present invention generally relates to a voltage regulator used for Integrated Circuit Card and a semiconductor integrated circuit (it is called simply IC hereinafter).

This application relies for priority on Japanese patent application, Serial Number 229374/2001, filed Jul. 30, 2001, which is incorporated herein by reference in its entirety.

2. Description of the Related Art

FIG. 2 is a system configuration figure showing an example of an integrated circuit card. This integrated circuit card has the internal logic part 2. This internal logic part 2 has EEPROM 1 (it is a nonvolatile memory which can elegy erase data stored therein), and CPU (Central Processing Unit) and ROM. The EEPROM 1 is a memory for memorizing data, such as personal information. The CPU is the equipment for performing data processing.

Furthermore, this integrated circuit card has a band gap 4 and a voltage regulator 3. The voltage regulator 3 adjusts a power-supply voltage VDD supplied from an external device, and supplies a constant voltage VREG to the internal logic part 2. The band gap 4 generates a reference voltage VR used as the reference of the voltage VREG and a constant current control signal CS.

The conventional voltage regulator used for the integrated circuit card is shown in FIG. 3(*a*) and FIG. 3(*b*). A series type voltage regulator is shown in FIG. 3(*a*), and a shunt type voltage regulator is shown in FIG. 3*b*.

The voltage regulator shown in FIG. 3(*a*) has a differential amplification circuit A which has an inverted input terminal − to which the reference voltage VR is applied. An output of the differential amplification circuit A is connected to a gate of a P type MOS transistor M1. A power-supply voltage VDD is applied to a source of the transistor M1 and a drain of the transistor M1 is connected to an output node N1. A voltage divider circuit which comprised of a resistor R1 and a resistor R2 is connected between the output node N1 and a ground potential GND. Comparison voltage VC generated from the voltage divider circuit is given to an non-inverted input terminal + of the amplification circuit A.

The constant current control signal CS for generating constant current is given to the amplification circuit A. The signal of the output node N1 is given to the amplification circuit A through a capacitor C1 for phase compensation. A capacitor C2 for voltage flat and smooth is connected between the output node N1 and the ground potential GND.

In this voltage regulator, the voltage VREG at the output node N1 is divided by the resistor R1 and the resistor R2 and is applied to the non-inverted input terminal + of the amplification circuit A as the comparison voltage VC (=VREGx R2/(R1+R2)). The voltage regulator receives the voltage VREG at the output node N1 and the reference voltage VR applied to the inverted input terminal − of the amplification circuit A, and compares and amplifies the voltage difference between the voltage VC and the voltage VR.

Therefore, if the comparison voltage VC is higher than the reference voltage VR, the output voltage VO of the amplification at A goes high, internal resistance (resistance between a source and a drain) of the transistor M1 increases, and the voltage VREG of the output node N1 falls. Conversely, if the comparison voltage VC is lower than the reference voltage VR, the output voltage VO of the amplification circuit A becomes low, internal resistance of the transistor M1 decreases, and the voltage VREG of the output node N1 goes up.

By the above feedback operation, the voltage VREG of the output node N1 is stabilized in the state where the comparison voltage VC coincides with the reference voltage VR. Therefore, it becomes VREG=VRx(1+R1/R2). In addition, since voltage change of the output node N1 by the feedback operation returns to the amplification circuit A through the capacitor C1, it is prevented that the amplification circuit A will be in an oscillation state. Moreover, since a very small current change caused by a load connected to the output node N1 is absorbed by the capacitor C2, the voltage VREG of the output node N1 is maintained almost uniformly.

The voltage regulator shown in FIG. 3(*b*) is replace with the transistor M1 of the voltage regulator shown in FIG. 3(*a*), and has a constant current circuit B which supplies constant current to the output node N1 from the power-supply voltage VDD. Furthermore, this voltage regulator has an N type MOS transistor M2 connected between the output node N1 and the ground potential GND and controlled by the output voltage VO of the amplification circuit A.

In this voltage regulator, the constant current is always supplied to the output node N1 by the constant current circuit B from the power-supply voltage VDD. Reduction of current which flows for the load connected to the output node N1 rises voltage VREG of the output node N1. By this, the output voltage VO of the amplification circuit A rises, the internal resistance of the transistor M2 decreases, and current which flows to this transistor M2 increases. Conversely, an increase of current which flows for load reduces voltage VREG of the output node N1. By this, the output voltage VO of the amplification circuit A falls, the internal resistance of the transistor M2 increases, and current which flows to this transistor M2 decreases. It is controlled by such feedback operation so that the sum of current which flows for the load connected to the output node N1, and current which flows to the transistor M2 becomes always constant, and the voltage VREG of the output node N1 is stabilized.

However, the following subjects occurred in the conventional voltage regulator.

For example, in the series type voltage regulator, when the power-supply voltage VDD is 5V. the voltage VREG at the output node N1 is 3V and the load current range between 0 and 10 mA, 0–10 mA current is supplied from the power-supply voltage VDD corresponding to the load current.

Therefore, the product of the voltage drop (2V) with the transistor M1 and the load current is lost, and it is satisfactory from the viewpoint of power consumption.

However, since current supplied from the power-supply voltage VDD corresponded to load current, there is a problem enable it to analyze operation of the internal logic part of the integrated cat card, by acting as the monitor of the change of current supplied from the exterior.

When analysis technique, such as DPA/SPA (Differential Power Analysis/Simple Power Analysis), is used especially, there is a possibility that the problem that secret data which should be protected on security will be decoded from a power-supply current waveform may occur.

On the other hand, at the shunt type voltage regulator shown in FIG. 3(*b*), since constant current always flows from the power-supply voltage VDD by the constant current circuit B, there is no possibility that an internal state may be decoded by the monitor of a power-supply current waveform. However, for this reason, regardless of actual load current, current which always exceeds 10 mA needed to be supplied and there is a problem in the viewpoint of power consumption.

Therefore, there are few increases in power consumption and the voltage regulator and IC with difficult analysis of operation of an internal logic circuit have been desired.

SUMMARY OF THE INVENTION

According to one aspect of the present invention, there is provided a voltage regulator includes a constant current circuit which is connected between an input node with which a power supply voltage is supplied and an output node to which a load is connected and which supplies constant current to the output node. The voltage regulator also includes a first tar which is provided in parallel to the constant current circuit and which flows insufficient current to the output node when current flowing through the load is larger than the constant current and a second transistor which is provided between the output node and a common potential node and which flows surplus current to the common potential node when current flowing through the load is less than the constant current. The voltage regulator also includes a control circuit which controls a conductive state of the first and the second transistors so that an output voltage of the output node is maintained at constant voltage.

The above and further objects and novel features of the invention will more fully appear from the following detailed description, appended claims, and accompanying drawings.

BRIEF DESCRIPTION OF TM DRAWINGS

Figure 3:
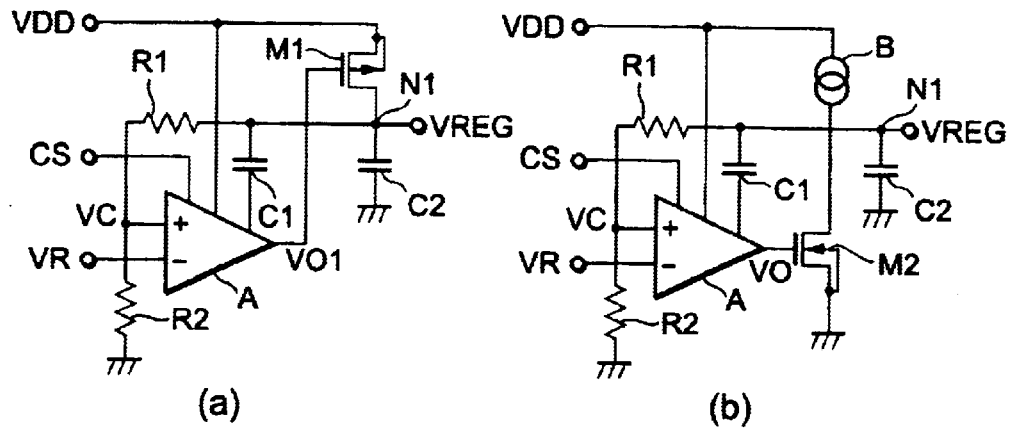

FIG. 3(a) and FIG. 3(b) are circuit diagrams showing voltage regulators of the related art.

Figure 4:
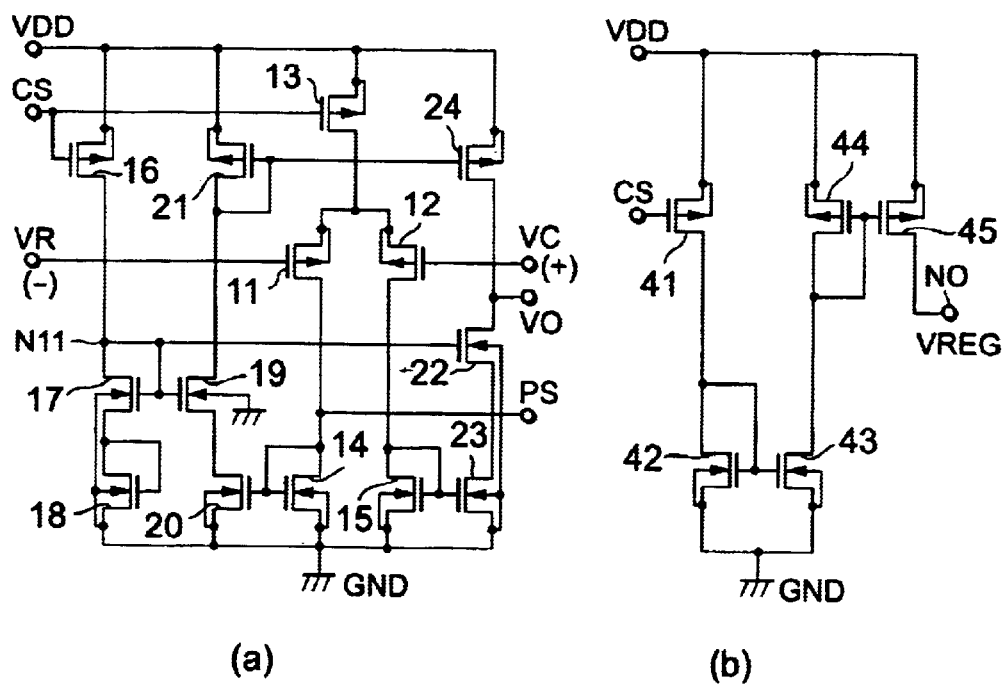

FIG. 4 is a circuit diagram showing a voltage regulator according to a first preferred embodiment of the present invention.

Figure 5:
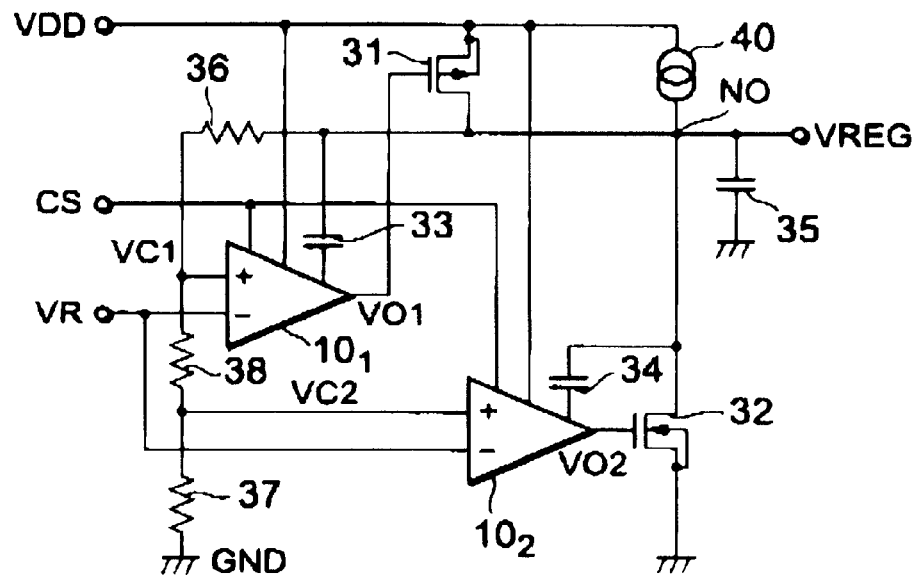

FIG. 5 is a circuit diagram showing a voltage regulator according to a second preferred embodiment of the present invention.

Figure 6:
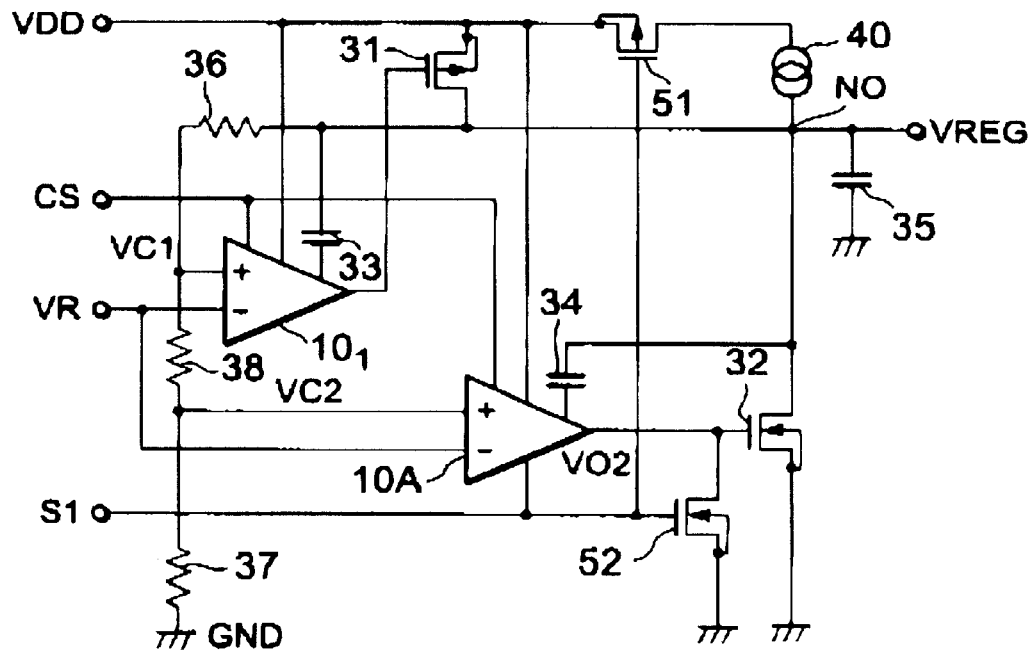

FIG. 6 is a circuit diagram showing a voltage regulator according to a third preferred embodiment of the present invention.

Figure 7:
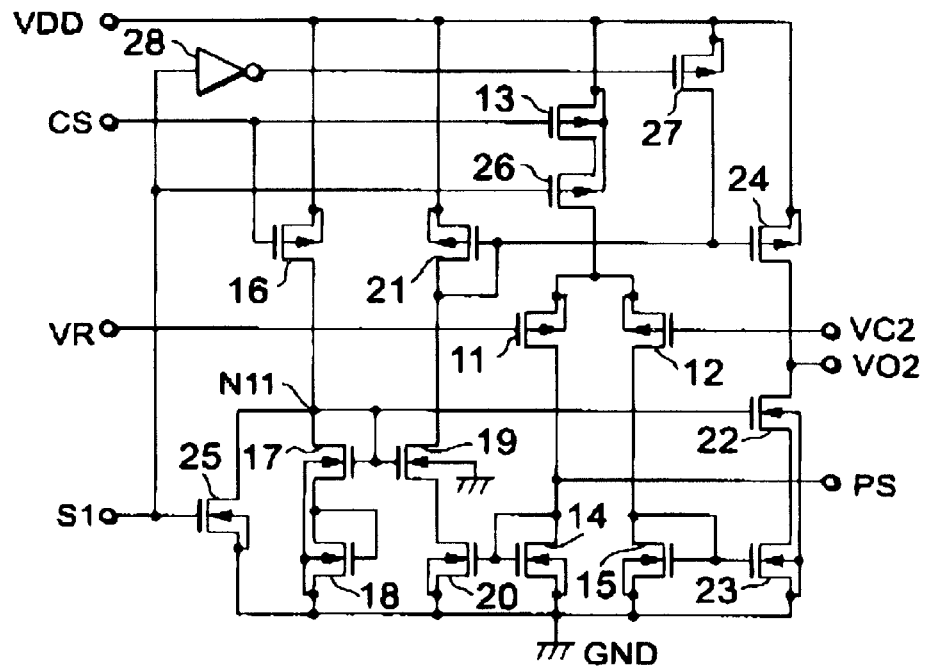

FIG. 7 is a circuit diagram showing an amplifier circuit 10A in FIG. 6.

Figure 8:
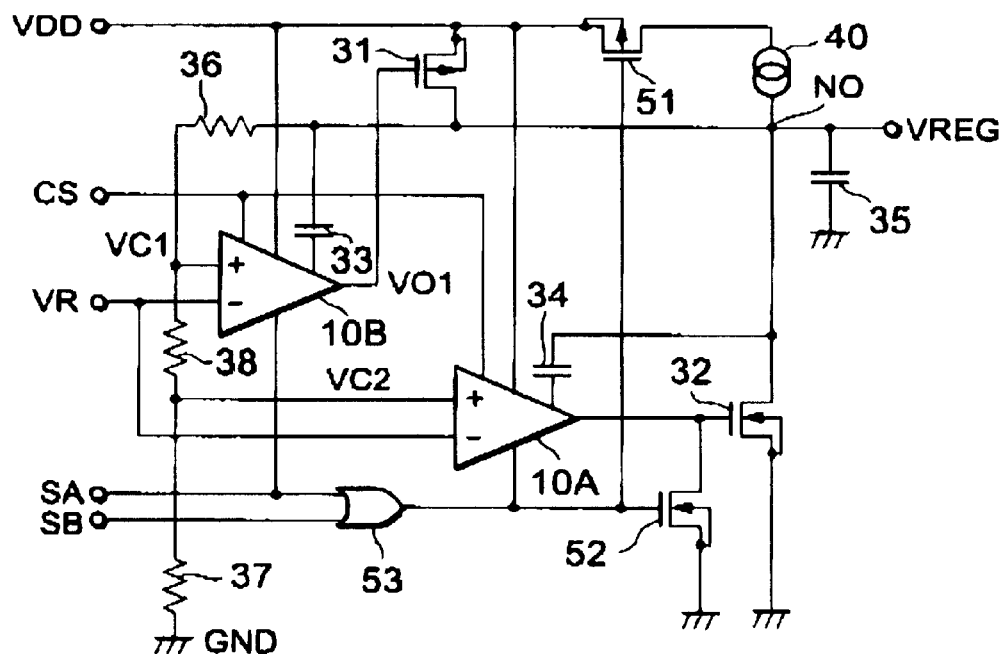

FIG. 8 is a circuit diagram showing a voltage regulator according to a fourth preferred embodiment of the present invention.

Figure 9:
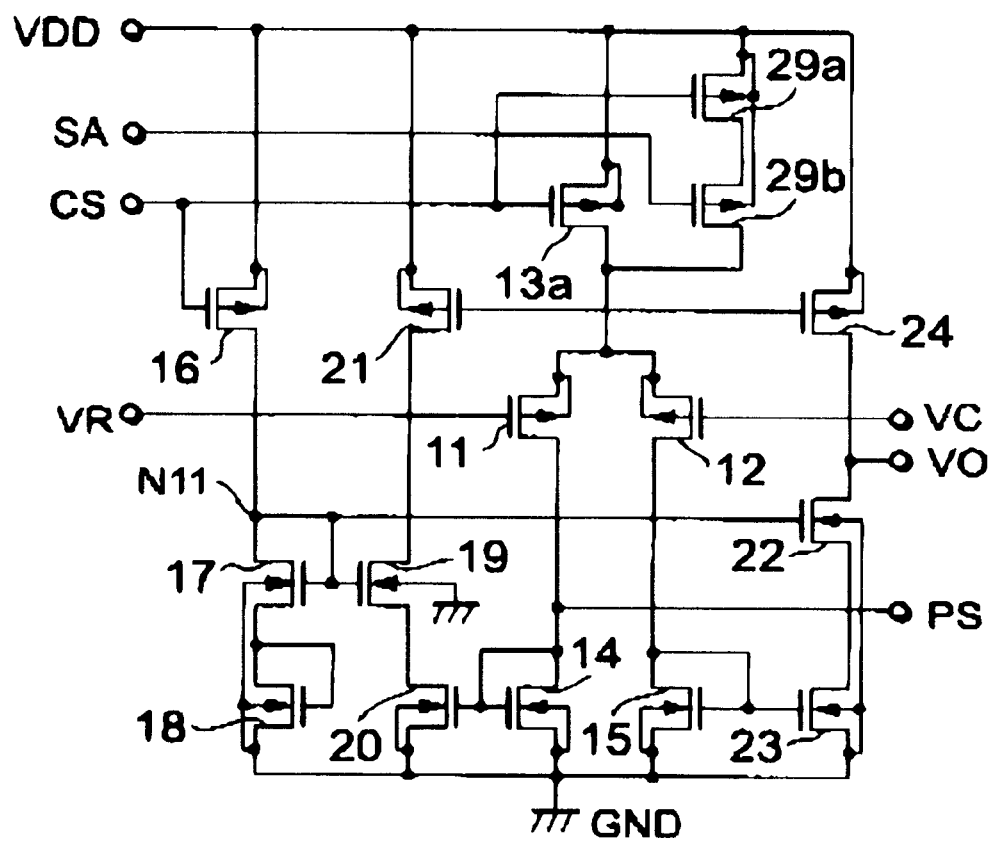

FIG. 9 is a circuit diagram showing an amplifier circuit 10B in FIG. 8.

DETAILED DESCRIPTION OF THE PREFERRED EMBODIMENT

A voltage regulator and a semiconductor integrated circuit according to the present invention will be explained hereinafter with reference to figures.

First Preferred Embodiment

Figure 1:
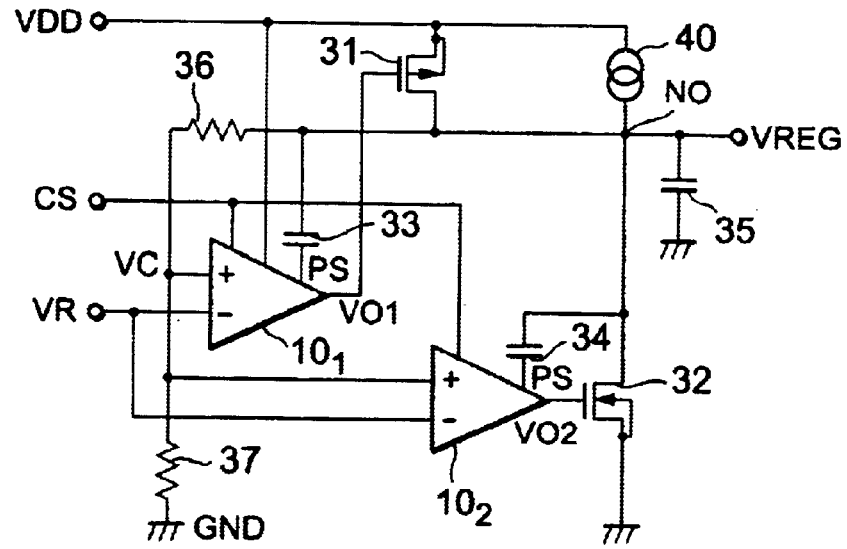
FIG. 1 is a circuit diagram showing a voltage regulator according to a first preferred embodiment of the present invention.
Figure 2:
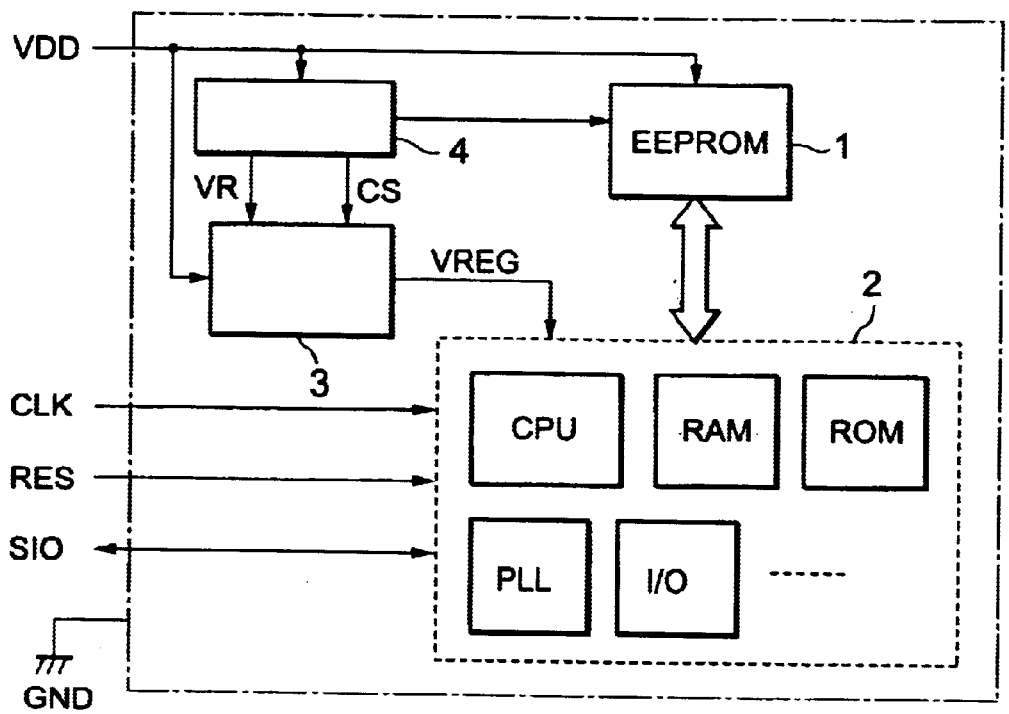
FIG. 2 is a schematic block diagram showing an IC card of the related art.

FIG. 1 is a circuit diagram showing a voltage regulator according to a first preferred embodiment of the present invention.

This voltage regulator has differential type amplification circuit 101 and amplification circuit 102 where a reference voltage VR is applied to an inverted input terminal –, and a comparison voltage VC is given to an non-inverted input terminal +. The amplification at 101 and the amplification circuit 102 are the same structures mutually. The output of the amplification circuit 101 is connected to a gate of a P channel MOS transistor 31 (hereinafter referred to as PMOS) and the output of the amplification circuit 102 is connected to a gate of an N channel MOS transistor 32 (hereinafter referred to as NMOS). A source of the PMOS 31 is supplied with the power-supply voltage VDD and a drain of the PMOS 31 is connected to the output node NO. A drain of the NMOS 32 is connected to the output node NO and a source of the NMOS 32 is connected to a ground potential GND.

The constant current control signal CS for generating constant current is applied to the amplification circuit 101 and the amplification circuit 102. Furthermore, the amplification circuit 101 and the amplification circuit 102 receive phase compensation signal PS through the capacitor 33 and the capacitor 34 for phase compensation so that operation stabilized, without being in an oscillation state may be performed.

The constant current circuit 40 is connected between the power-supply voltage VDD) and the output node NO. The constant current circuit 40 is set up so as to flow constant current having about a half of an average load current. Moreover, between the output node NO and the ground potential GND, the capacitor 35 for voltage flat and smooth is connected.

Furthermore, between the output node NO and the ground potential GND, a voltage dividing circuit which comprised of resistor 36 and resistor 37 is connected, and the comparison voltage VC generated by the voltage dividing circuit is applied to the non-inverted input terminal + of the amplification circuit 101, and the non-inverted input terminal + of the amplification circuit 102. Voltage VREG adjusted to desired constant voltage is output from the output node NO to the load circuit not illustrated.

FIG. 4(a) and FIG. 4(b) is a circuit diagram showing an example of the amplification circuit in FIG. 1, and a constant current circuit.

This amplification circuit has a PMOS 11 and a PMOS12 which constitute a differential input part. The reference voltage VR is applied to a gate of the PMOS 11 and the comparison voltage VC is applied to a gate of PMOS 12. Sources of the PMOS 11 and the PMOS 12 are commonly connected to the power-supply voltage VDD through a PMOS 13. The constant current control signal CS is applied to a gate of the PMOS 11, and constant current supplies the PMOS 11 and the PMOS 12 through this PMOS 13. Drains of the PMOS 11 and the PMOS 12 are connected to the ground potential GND through NMOS 14 and NMOS 15 by which diode connection is made in the direction of order, respectively.

Furthermore, this amplification circuit has a PMOS 16 constituted so that constant current might be passed based on the constant current control signal CS, source of this PMOS 16 is connected to the power-supply voltage VDD, and drain of this PMOS 16 is connected to the node N11. A drain and a gate of an NMOS 17 are conned to the node N11, and a source of this NMOS 17 is connected to a gate and a source of an NMOS 18. The souse of the NMOS 18 is connected to the ground potential GND.

A gate of an NMOS 19 is connected to the node N11, and a source of this NMOS 19 is connected to the ground potential GND through an NMOS 20. Moreover, a gate of the NMOS 20 and a gate of an NMOS 14 are connected to a drain of the NMOS 14. The Phase compensation signal PS gives the gate of the NMOS 20. A drain of the NMOS 19 is connected to a drain and a gate of a PMOS 21, and a source of the PMOS 21 is connected to the power-supply voltage VDD.

Furthermore, a gate of a NMOS 22 is connected to the node N11, and a source of the NMOS 22 is connected to the ground potential GND through an NMOS 23. Moreover, a gate of the NMOS 23 and a gate of a NMOS 15 are connected to a drain of the NMOS 15. A drain of the NMOS 22 is connected to a drain of a PMOS 24. A source and a gate of the PMOS 24 are connected to the power-supply voltage VDD and the PMOS 21, respectively.

In such an amplification circuit, the voltage difference between the reference voltage VR and the comparison voltage VC which are inputted into the PMOS 11 and the PMOS 12 comprised of a differential input part is amplified. The output voltage VO is output from the connecting point of drains of the NMOS 22 and the PMOS 24.

On the other hand, as shown in FIG. 3(b), a constant current circuit has a PMOS 41 so as to flow constant current based on the constant current control signal CS. A source of the PMOS 41 is connected to the power-supply voltage VDD, and a drain of the PMOS 41 is connected to a gate and a drain of an NMOS 42. Source of the NMOS 42 is connected to the ground potential GND.

A gate of an NMOS 43 which constitutes a current mirror circuit to the NMOS 42 is connected to a drain of the NMOS 42. Source of the NMOS 43 is connected to the ground potential GND, and a drain of the NMOS 43 is connected to a drain and a gate of the PMOS 44. Source of the PMOS 44 is connected to the power-supply voltage VDD.

A gate of a PMOS 45 which constitutes a current mirror circuit to the PMOS 44 is connected to the drain of the PMOS 44. A Source of the PMOS 45 is connected to the power-supply voltage VDD, and a drain of the PMOS 45 is connected to an output node NO of a voltage regulator.

In such a constant current circuit, desired constant current is supplied to the output node NO by setting dimension of the gate width and gate length of each transistor so that it may become a predetermined ratio. For example, if current of 50 µA flows to the PMOS 41 and the NMOS 42 based on the constant current control signal CS, in proportion to current which flows to this NMOS 42, current of 500 µA flows to the NMOS 43. Thereby, current of 500 µA flows also to the PMOS 44, in proportion to current which flows to the PMOS 44, current of 5 mA flows to the NMOS 45. And 5 mA constant current is supplied to the output node NO.

Next, operation of the circuit shown in FIG. 1 is explained.

First, the load circuit not illustrated is connected to the output node NO. This load circuit has a condition that predetermined voltage VREG of 3V is appeared at the output node NO and load current changes in the range of 0–10 mA when the load circuit is connected to the output node NO.

From the exterior, the power-supply voltage VDD of 5V is supplied, for example, and when stable reference voltage VR and the constant current control signal CS are applied, 5 mA constant current is supplied to the output node NO through the constant current circuit 40.

Simultaneously, the gate of the PMOS 31 serving as constant current source connected in parallel with the constant current circuit 40 is controlled by the output voltage VO1 of the amplification circuit 101. Moreover, the gate of the NMOS 32 connected in parallel with the load circuit is controlled by the output voltage VO2 of the amplification circuit 102.

Voltage of the output node NO is divided by the resistor 36 and the resistor 37 and it is given to the input side of the amplification circuit 101 and the amplification circuit 102 as the comparison voltage VC. The reference voltage VR set up so that this output node NO might serve as predetermined voltage VREG is given to the input side of the amplification circuit 101 and the amplification circuit 102

Thereby, where the output node NO is set to voltage VREG, the output voltage VO1 of the amplification circuit 101 and the output voltage VO2 of the amplification circuit 102 we stabilized, and stable constant voltage VREG is outputted.

For example, when load current is 10 mA, 5 mA is supplied through the constant current circuit 40, and 5 mA of an insufficiency is supplied to the output node NO through the PMOS 31. And the NMOS 32 enters into an OFF state.

Moreover, when load current is 1 mA, the PMOS 31 enters into an OFF state, 1 mA is supplied to the load circuit in 5 mA supplied to the output node NO from the constant current circuit 40, and 4 mA for a surplus (remaining) flows to the ground potential GND through the NMOS 32.

As mentioned above, the voltage regulator of the first preferred embodiment has the PMOS 31 provided in parallel with the constant current circuit 40 and the NMOS 32 provided in parallel with the load circuit. These PMOS 31 and NMOS 32 may be controlled so that the output node NO may serve as voltage VREG.

Since current supplied from the power-supply voltage VDD becomes constant value unless load cent which flows in a load circuit exceeds the capability of the constant current circuit 40, the analysis of the internal state of the load circuit (internal logic circuit) by the monitor of a power-supply current waveform becomes impossible.

Moreover, since only the insufficiency is supplied from the PMOS 31 when load current exceeds the capability of the constant current circuit 40, there is little change of current supplied from the power-supply voltage VDD, and the analysis of the internal state of a load at becomes very difficult.

Therefore, by setting current of the constant current circuit 40 as suitable value, the voltage regulator to which power consumption is not made to almost increase and with the difficult analysis of a load circuit of operation can be obtained.

Second Preferred Embodiment

FIG. 5 is a circuit diagram showing a voltage regulator according to a second preferred embodiment of the present invention. In FIG. 5, wherein like elements are given like reference characters in FIG. 1.

The difference between the second embodiment and the first embodiment resides in that a resistor 38 is connected between the resistor 36 and the resistor 37. The sum of resistance value of this resistor 36 and resistance value of the resistor 38 is set as the resistance value of the resistor 36 in FIG. 1. The comparison voltage VC1 appeared at a connection point where the resistor 36 and the resistor 38 are connected to each other may be applied to the non-inverted input terminal + of the amplification circuit 101. The comparison voltage VC2 appeared at a connection point where the resistor 37 and the resistor 38 are connected to each other may be applied to the non-inverted input terminal + of the amplification circuit 102.

The resistance value of the resistor 38 is set as the resistance value which can give the potential difference more than the variation voltage of offset of the amplification circuit 101 and the amplification circuit 102 to the non-inverted input terminal + of the amplification circuit 101 and the amplification circuit 102. In addition, the resistance ratio of the resistor 36, the resistor 38, and the resistor 37 is set up so that the Comparison voltage VC2 equal to the level of the reference voltage VR to the voltage VREG of the output node NO. That is, when the resistance value of the resistor 36, the resistor 38, and the resistor 37 is R36, and R38 and R37, respectively, the reference voltage VR is expressed with the following formula.

VR=VREG×R37/(R36+R38)+R37

Moreover, the drive capability of the amplification circuit 102 is set up more greatly than the amplification circuit 102. Other structures are the same as that of FIG. 1.

Next, operation is explained.

When the power-supply voltage VDD is supplied and the reference voltage VR, the constant current control signal CS, and the constant current circuit 40 are stabilized, the output voltage VO1 of the amplification circuit 101 tends to control the gate of the PMOS 31 serving as current source so that the comparison voltage VC1 is set to the same level as the reference voltage VR. Moreover, the output voltage VO2 of the amplification circuit 102 controls the gate of the NMOS 32 so that the comparison voltage VC2 is set to the same level as the reference voltage VR.

At this time, since drive capability of the amplification circuit 101 is larger than that of the amplification circuit 102, the comparison voltage VC2 is set to the reference voltage VR. And the comparison voltage VC1 is set to a level high a little to the reference voltage VR by having formed resistor 38. Therefore, the voltage VREG becomes constant voltage by the amplification circuit 102 and NMOS 32 and comes to be supplied to an inside as internal voltage.

Since the comparison voltage VC1 is higher than the reference voltage VR, the output voltage VO1 of the amplification circuit 101 is H level, and the PNOS 31 serving as current source is in an OFF state. That is, in usual, current supply to inside is performed only by the constant current circuit 40.

When current consumption of an internal circuit exceeds the supply capability of the constant current circuit 40, the voltage VREG falls gradually and the comparison voltage VC1 approaches the reference voltage VR. When the comparison voltage VC1 is more nearly less than the reference voltage VR, the output voltage VO1 of the amplification circuit 101 falls, the PMOS 31 serving as current source is changed into an ON state and the comparison voltage VC1 tends to raise. Namely, when current consumption of an internal circuit exceeds the supply capability of the constant current circuit 40, the voltage VREG of the output node NO is controlled by the amplification circuit 101 and the amplification circuit 102, and the PMOS 31 and the NMOS 32.

As mentioned above, in the voltage regulator of the second embodiment, the comparison voltage VC1 applied to the amplification circuit 101 is set so that it may become higher than the comparison voltage VC2 applied to the amplification circuit 102. Thereby, priority is given to control of the NMOS 32 over the PMOS 31, and current supply to an internal circuit is supplied from the constant current circuit 40. Therefore, since current is supplied from the PMOS 31 only when the supply capability of the constant current circuit 40 is exceeded, there is an advantage that the monitor of internal current consumption becomes difficult and the effect of the measure against security becomes large further.

Third Preferred Embodiment

FIG. 6 is a circuit diagram showing a voltage regulator according to a third preferred embodiment of the present invention. In FIG. 6, wherein like elements are given like reference characters in FIG. 5.

This voltage regulator is replaced with the amplification circuit 102 in FIG. 5, and has amplification circuit 10A whose operation is controlled by the control signal S1. Moreover, while a PMOS 51 for a switch by which ON/OFF control is carried out with a control signal S1 is provided between the power-supply voltage VDD and the constant current circuit 40 in series, an NMOS 52 for a switch by which ON/OFF control is carried out with this control signal S1 is provided between the output side of amplification circuit 10A, and the ground potential GND. Other structures are the same as that of FIG. 5.

FIG. 7 is one example of circuit diagram showing an amplifier circuit 10A in FIG. 6. In FIG. 7, wherein like elements are given like reference characters in FIG. 4(a).

In this amplification circuit 10A, an NMOS 25, a PMOS 26, a PMOS 27, and the inverter 28 are added to the amplification circuit of FIG. 4(a).

The NMOS 25 is connected between the node N11 and the ground potential GND, and a gate of the NMOS 25 is controlled by the control signal S1. The PMOS 26 is inserted between sources of the PMOS 11 and the PMOS 12, and a drain of the PMOS 13, and a gate of the PMOS 26 is controlled by the control signal S1. Moreover, a PMOS 27 is connected between the gate of a PMOS 24 and a source of the PMOS 24, and a gate of the PMOS 24 is controlled by an inverted control signal S1 inverted by the inverter 28.

Next, operation is explained.

When the control signal S1 is L level, the PMOS 51 is in an ON state and the NMOS 52 is in an OFF state. In the amplification circuit 10A, the NMOS 25 and the PMOS 27 are in OFF states, and the PMOS 26 is in an ON state. Therefore, operation of the voltage regulator of the FIG. 6 in case the control signal S1 is L level is the same as that of the voltage regulator of FIG. 5.

On the other hand, when the control signal S1 is H level, the PMOS 51 is in an OFF state and the NMOS 52 is in an ON state. Thereby, while the constant current circuit 40 is disconnected from the power-supply voltage VDD, the output side of amplification circuit 10A is fixed to L level, and the NMOS 32 in an OFF state. In amplification circuit 10A, the NMOS 25 and the PMOS 27 are in ON states, and the PMOS 26 is in an OFF state. Therefore, almost all the current passes of amplification circuit 10A are cut off.

Therefore, when the control signal S1 is H level, this voltage regulator serves as the same structure as the voltage regulator of the conventional series type of FIG. 3(a).

As mentioned above, in the third preferred embodiment, the voltage regulator has the PMOS 51 for disconnecting the constant current circuit 40 from the power-supply voltage VDD according to the control signal S1 and the NMOS 52 which is connected in parallel with the output node NO and for changing the NMOS 32 into an OFF state. Furthermore, the voltage regulator has the amplification circuit 10A by which almost all operation is stopped with this control signal S1. For this reason, in addition to the same advantage as the second embodiment, in the case of the state of operation where security does not pose a problem, there is an advantage that power consumption is reducible for being earned out by enabling it to constitute a series type voltage regulator, by setting the control signal S1 as H level.

Fourth Preferred Embodiment

FIG. 8 is a circuit diagram showing a voltage regulator according to a fourth preferred embodiment of the present invention. In FIG. 8, wherein like elements are given like reference characters in FIG. 6.

This voltage regulator is replaced with the amplification circuit 102 in FIG. 6, and has amplification at 10B whose operation is controlled by standby signal SA. Moreover, the logic OR gate 53 (hereafter referred to as OR) for taking the logic sum of standby signal SA and the control signal SB is provided. The amplification circuit 10A, and the PMOS 51 and the NMOS 52 are controlled by this output signal of OR 53. Other structures are the same as that of FIG. 6.

FIG. 9 is a circuit diagram showing an amplifier circuit 10B in FIG. 8. In FIG. 9, wherein like elements are given like reference characters in FIG. 4(a).

In this amplification circuit 10B, a PMOS 29a and a PMOS 29b connected n-series are added to the amplification circuit of FIG. 4(a). Furthermore, a PMOS 13a with little current capacity is replaced with the PMOS 13.

The gate width of the PMOS 13a is set as the minimum size which can drive the PMOS 31 by amplification circuit 10B. And the gate width of the PMOS 13a is set so that the sum total of the gate width of this PMOS 13a and the gate width of the PMOS 29a may become equal to the gate width of the PMOS 13.

A source of the PMOS 29a is connected to the power-supply voltage VDD, and a drain of the PMOS 29a is connected to a source of the PMOS 29b. Furthermore, a drain of the PMOS 29b is connected to a drain of the PMOS 13a. The constant current control signal CS and the standby signal SA are applied to a gate of the PMOS 29a and a gate of the PMOS 29b, respectively. Other structures are the same as that of FIG. 4(a).

Next, operation is explained.

When the both of the standby signal SA and the control signal SB are L level, the PMOS 51 is in an ON state and the NMOS 52 is in an OFF state. In the amplification circuit 10A, the NMOS 25 and the PMOS 27 are in OFF states, and the PMOS 26 is in an ON state. Furthermore, in the amplification circuit 10B, the NMOS 29b is in an ON state and the PMOS 13a and the PMOS 29a are connected in parallel. Therefore, operation of the voltage regulator of the FIG. 8 in case the standby signal SA and the control signal SB are L levels is the same as that of the voltage regulator of FIG. 5.

When the standby signal SA is L level and the control signal SB is H level, the PMOS 51 is in an OFF state and the NMOS 52 is in an ON state. Thereby, while the constant current circuit 40 is electrically separated from the power-supply voltage VDD and the output side of the amplification circuit 10A is fixed to L level, and thus the NMOS 32 is in an OFF state. Moreover, in the amplification circuit 10A, the NMOS 25 and the PMOS 27 are in ON states, the PMOS 26 is in an OFF state and thus almost all the current passes in this amplification circuit 10A are cut off. Furthermore, in the amplification circuit 10B, the PMOS 29b is in an ON state and the PMOS 13a and the PMOS 29a are connected in parallel. Therefore, where the standby signal is L level and the control signal SB is H level this voltage regulator serves as the structure as the voltage regulator of the conventional series type of FIG. 3(a).

When the standby signal SA is H level, regardless of the level of the control signal SB, the PMOS 51 is in an OFF state and the NMOS 52 will is in an ON state. Thereby, the constant current circuit 40 is electrically separated form the power-supply voltage VDD and the output side of the amplification circuit 10A is fixed to L level, and thus the NMOS 32 is in an OFF state. Moreover, in the amplification circuit 10A, the NMOS 25 and the PMOS 27 is in an ON state, the PMOS 26 is in an OFF state and almost all the current passes in this amplification circuit 10A is cut off. On the other hand, in the amplification circuit 10B, the PMOS 29b is in an OFF state and the PMOS 13b is detached. Thereby, while the drive capability to the PMOS 31 of the amplification circuit 10B declines, the power consumption of this amplification circuit 10b declines. Therefore, when the control signal SA is L level, this voltage regulator serves as the series type structure in the low power-consumption mode.

As mentioned above, in the fourth embodiment, the voltage regulator has the amplification circuit 10B which enters in to the low power-consumption mode according to the standby signal SA. Therefore, the voltage regulator can be operated in the low power-consumption mode at the time of standby, by using standby signal SA and the control signal SB.

In addition, this invention is not limited to the above-mentioned case of the operation, but various modifications is possible for it. As a modification, there are followings, for example.

(a) A bipolar transistor may be replaced with the PMOS 31 and the NMOS 32

(b) The structure of the amplification circuit 10 or the constant current circuit 40 is not limited to what is illustrated, but if the same operation is possible, it can apply the thing of any circuit structures.

(c) The connection point, where the capacitor 33 for phase compensation and the capacitor 34 for phase compensation are connected to each other, is not limited to the point illustrated in figures. The connection point may be set at a point so that an amplification circuit will not be in an oscillation state by phase compensation.

(d) The PMOS, whose ON/OFF state is controlled by the controls signal S1 and which is connected between output node NO and the NMOS 32, may be replaced with the NMOS 52 in FIG. 6 and FIG. 8.

(e) The OR 53 in FIG. 8 is omitted and the amplification circuit 10A and the amplification circuit 10B may be made to control by the standby signal SA. In this case, a security mode for operation which needs security and a low power-consumption operation mode can be selected by the standby signal SA.

As explained above in detail, according to the first invention, the voltage regulator has the constant current circuit which supplies constant current, the first transistor provided in parallel to this constant cent circuit, and the second transistor provided between an output node and a common potential. Thereby, when load current exceeds the constant current, current of an insufficiency is supplied from the first transistor. Therefore, the increase in power consumption is suppressed and the analysis of the load circuit by the monitor of load current of operation becomes difficult.

According to the second invention, the voltage regulator has the first amplification circuit which compares the first divided voltage and a reference voltage and which controls the first transistor, and the second amplification circuit which compares the second divided voltage lower than the first divided voltage and reference voltage and which controls the second transistor. Thereby, since the first transistor is controlled previously, penetration current which flows from power-supply voltage to the common potential through the first and the second transistor can be prevented.

According to the third invention, the voltage regulator has a switch means to stop current which flows to a constant current circuit and the second transistor according to the control signal. Thereby, useless consumption current can be lost in the application which does not need security.

According to the fourth invention, the voltage regulator has a switch means to stop current which flows to a constant current circuit and the second transistor according to a control signal. Furthermore, it has a structure to stop amplification operation of the second amplification circuit with this control signal. Thereby, in the application which does not need security, consumption current can be reduced further.

According to the fifth invention, the voltage regulator has a switch means to stop current which flows to a constant current circuit and the second transistor when a standby signal or a control signal is applied. Furthermore, it has a structure so that operation of the second amplification circuit may be stopped. Furthermore, when a standby signal is received, the first amplification circuit may be made into the low consumption current mode. Thereby, in the application which does not need security, while power consumption can be reduced, at the time of standby, reduction of power consumption is further attained by the low consumption current mode.

According to the sixth to eighth inventions, the voltage regulator has the first adjustment means which controls current which flows from an input node to the first node based on the voltage difference of the first divided voltage and reference voltage and the second adjustment means which controls current which flows from the first node to the second node based on the voltage difference of the second divided voltage and reference voltage. Thereby, when load current exceeds the supply capability of the constant current source, current of an insufficiency is supplied from the first adjustment means. Therefore, the analysis of the load circuit by the monitor of load current of operation becomes difficult.

While the preferred form of the present invention has been described, it is to be understood that modifications will be apparent to those skilled in the art without departing from the spit of the invention. The scope of the invention, namely, is to be determined solely by the following claims.

What is claimed is:

1. A voltage regulator comprising:
    a constant current circuit which is connected between an input node with which a power supply voltage is supplied and an output node to which a load is connected and which supplies constant current to the output node;
    a first transistor, which is provided in parallel to the constant current circuit and which flows insufficient current to the output node when current flowing through the load exceeds the constant current;
    a second transistor, which is provided between the output node and a common potential node and which flows surplus current to the common potential node when current flowing through the load is less than the constant current; and
    a control circuit, which controls a conductive state or the first and the second transistors so that an output voltage of the output node is maintained at constant voltage.

2. A voltage regulator according to claim 1, wherein the control circuit comprises:
    a voltage dividing circuit, which divides the output voltage and which generates a first divided voltage and a second divided voltage lower than the first divided voltage;
    a first amplification circuit, which amplifies a voltage difference between the first divided voltage and a reference voltage and which controls the first transistor; and
    a second amplification circuit which amplifies a voltage difference between the second divided voltage and the reference voltage and which controls the second transistor.

3. A voltage regulator according to claim 2, further comprising:
    a switch which stops current flowing through the constant current circuit and the second transistor when a standby signal and a control signal are received, and
    wherein the first amplification circuit enters into a low power consumption mode when the standby signal is received, and
    wherein the second amplification circuit stops operating when either the standby signal or the control signal is received.

4. A voltage regulator according to claim 2, further comprising a switch which stops current flowing through the constant current circuit and the second transistor when a control signal is received.

5. A voltage regulator according to claim 4, wherein the second amplification circuit stops operating when the control signal is received.

6. A voltage regulator according to claim 1, further comprising a switch which stops current flowing through the constant current circuit and the second transistor when a control signal is received.

7. A voltage regulator according to claim 6, wherein the second amplification circuit stops operating when the control signal is received.

8. A semiconductor integrated circuit comprising:
    an input node, which is supplied with a first voltage;
    an output node, which is coupled to a first node;
    a second node, which is supplied with a second voltage lower than the first voltage;
    a constant current source, which is coupled between the input node and the first node;
    a first adjustment circuit which controls the amount of current flowing between the input node and the first node according to a voltage level of a first control signal; and
    a second adjustment circuit which controls the amount of current flowing between the first node and the second node according to a voltage level of a second control signal.

9. A voltage regulator according to claim 8, further comprising:
    a first amplification circuit which amplifies a voltage difference between a reference voltage and a first divided voltage and which outputs the first control signal; and
    a second amplification circuit, which amplifies a voltage difference between a reference voltage and a second divided voltage and which outputs the second control signal.

10. A voltage regulator according to claim 9, wherein the first adjustment circuit comprises a P type MOS transistor and wherein the second adjustment circuit comprises an N type MOS transistor.

11. A voltage regulator comprising:

means connected between an input node with which a power supply voltage is supplied and an output node to which a load is connected, for supplying constant current to the output node;

a first semiconductor means, provided in parallel to the constant current supplying means, circuit and which flows for supplying insufficient current to the output node when current flowing through the load exceeds the constant current;

a second semiconductor means, provided between the output node and a common potential node, passing flows current of surplus current to the common potential node when current flowing through the load does not reach the constant current; and a control circuit, which controls a conductive state of the first and the second semiconductor means so that an output voltage of the output node is maintained.

12. A voltage regulator according to claim 11, wherein the control circuit comprises:

a voltage dividing circuit, which divides the output voltage and which generates a first divided voltage and a second divided voltage lower than the first divided voltage;

a first amplification circuit, which amplifies a voltage difference between the first divided voltage and a reference voltage and which controls the first semiconductor means; and a second amplification circuit which amplifies a voltage difference between the second divided voltage and the reference voltage and which controls the second semiconductor means.

13. A voltage regulator according to claim 12, further comprising:

a switch, which stops current flowing through the constant current supplying means and the second semiconductor means when a standby signal and a control signal are received, and wherein the first amplification circuit enters into a low power consumption mode when the standby signal is received, and wherein the second amplification circuit stops operating when either the standby signal or the control signal is received.

14. A voltage regulator according to claim 12, further comprising a switch, which stops current flowing through the constant current supplying means and the second semiconductor means when a control signal is received.

15. A voltage regulator according to claim 14, wherein the second amplification circuit stops operating when the control signal is received.

16. A voltage regulator according to claim 11, further comprising a switch which stops current flowing through the constant current supplying means and the second transistor when a control signal is received.

17. A voltage regulator according to claim 16, wherein the second amplification circuit stops operation thereof when the control signal receives.

18. A voltage regulator according to claim 11, wherein the first semiconductor means and the second semiconductor means are respectively a first transistor and a second transistor.

* * * * *